United States Patent
Kim et al.

[11] Patent Number: 6,153,141
[45] Date of Patent: Nov. 28, 2000

[54] SEMICONDUCTOR PACKAGING METHOD

[75] Inventors: Jong Kyung Kim; Dong Jin Moak; Chang Hun Hyum; Chul Huh, all of Seoul, Rep. of Korea

[73] Assignee: Motorola, Inc., Schaumburg, Ill.

[21] Appl. No.: 08/155,881

[22] Filed: Nov. 23, 1993

[51] Int. Cl.[7] .......................... B29C 31/08; B29C 45/02; B29C 33/02
[52] U.S. Cl. ................ 264/328.14; 264/272.17; 264/328.5
[58] Field of Search .............. 264/272.17, 328.4, 264/328.5, 272.14, 328.17, 328.14; 425/116, 129.1, 544, 588

[56] References Cited

U.S. PATENT DOCUMENTS

| | | |
|---|---|---|
| 4,569,814 | 2/1986 | Chong et al. ........................ 264/328.5 |
| 4,653,993 | 3/1987 | Boschman .......................... 264/272.17 |
| 4,927,590 | 5/1990 | Poelzing .............................. 264/328.17 |
| 5,082,615 | 1/1992 | Sakai .................................. 264/272.17 |
| 5,169,586 | 12/1992 | Noda .................................. 264/328.8 |
| 5,204,122 | 4/1993 | Konishi ................................ 425/588 |
| 5,275,546 | 1/1994 | Fierkens ............................... 425/116 |

*Primary Examiner*—Angela Ortiz
*Attorney, Agent, or Firm*—William E. Koch

[57] ABSTRACT

A container (10), which holds a molding material (12), is attached to a mold. The molding material passes from the container to the mold through an orifice (18) during the molding process. The container is gradiently heated with the hottest part of the container near the orifice, the heat gradually decreasing towards the opposite end of the container. The hotter molding material deforms faster than the cooler material and as the plastic is forced into the mold, the air escapes past the molding material along the container walls in the direction of the cooler material. A mechanism (16), preferably a narrow ram having a slightly conical shape (22), forces the molding material into the mold. The conical shape allows the air to pass by the mechanism out the end of the container opposite the orifice.

4 Claims, 1 Drawing Sheet

SEMICONDUCTOR PACKAGING METHOD

FIELD OF THE INVENTION

This invention relates in general to semiconductor packaging and more specifically to eliminating flaws in the semiconductor packaging caused by air pockets.

BACKGROUND OF THE INVENTION

Semiconductor packaging is accomplished by forcing a molding material, usually a plastic or plastic epoxy, into a mold to cover the semiconductor circuitry. The plastic is very hard but when initially heated, becomes quite malleable allowing the plastic to be forced into the mold.

The plastic molding material is usually shipped to the packaging plants in pellet form, often looking similar to hockey pucks. Several of these pellets are placed into a container which is connected to the packaging mold. An orifice or small opening joins the container and the packaging mold to allow the heated plastic to be forced from the container into the mold.

The container is heated to soften the pellets into malleable material. Once the material has been softened sufficiently, a press mechanism is inserted into the container to force the plastic into the mold.

One of the problems associated with this process is the presence of air pockets which are trapped within the plastic and flow with the plastic into the mold. As the plastic cools, the entire packaging hardens and these air pockets form voids within the semiconductor chip package. Such voids allow the circuitry pad to corrode and causes package delamination. The obvious result is rejection of the part by the manufacturer's customer and reduction in product yield.

Therefore, it would be advantageous to have an apparatus and method which eliminated the air trapped within the plastic during the molding process to avoid air pockets and eventual corrosive voids.

SUMMARY OF THE INVENTION

Briefly stated, the present invention relates to a mechanism and method for a molding process that eliminates air pockets within the final molded product. A container, which holds a molding material, is attached to a designated mold. The molding material passes from the container to the mold through an orifice during the molding process. The container is gradiently heated with the hottest part of the container near the orifice, and the heat gradually decreasing towards the opposite end of the container. The hotter molding material deforms faster than the cooler material, and as the plastic is forced into the mold, the air escapes past the molding material along the container walls in the direction of th e cooler material. A mechanism, preferably a narrow ram having a slightly conical shape, forces the molding material into the mold. The conical shape allows the air to pass by the mechanism out the end of the container opposite the orifice.

BRIEF OF THE DRAWINGS

DETAILED DESCRIPTION OF THE PROFFERED EMBODIMENTS

Figure 1:
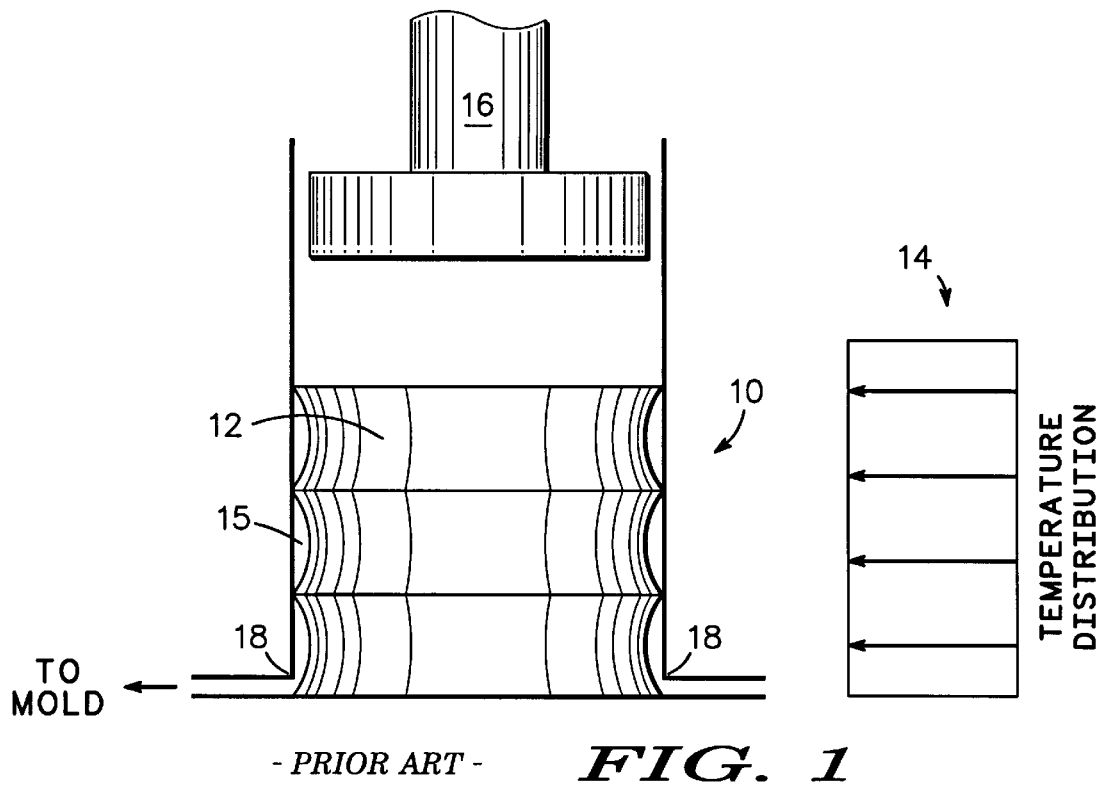
FIG. 1 shows a conventional molding process an d apparatus.

FIG. 1 depicts a conventional molding process for a semiconductor packaging process. The actual package mold is not shown.

In FIG. 1, a container 10 is shown having the packaging pellets or molding material 12 inside. The molding material 12 for semiconductor packaging is normally a plastic epoxy. Prior to heating, molding material 12 is a hard, powdery looking substance that is supplied in pellet form. Two or three pellets are often used to package a given number of chips. These pellets are placed into container 10 one on top of the other.

As molding material 12 is heated, a chemical reaction occurs and molding material 12 becomes quite malleable. The degree of heat will determine how malleable molding material 12 becomes. In conventional packaging processes, container 10 is uniformly heated which in turn heats molding material 12 uniformly as shown by the temperature distribution graph 14. Molding material 12 then has a uniform consistency. A mechanism 16 which fits snug into container 10 then deforms molding material 12 and presses it through a small opening or orifice 18 and into the package mold (not shown).

As mechanism 16 compresses molding material 12 through orifice 18, molding material 12 deforms in a non-uniform manner. Quite often as mechanism 16 pushes down on molding material 12, material 12 deforms to the walls of container 10, trapping air beneath in pockets (as indicated by 15). With no exit for the air to escape, these air pockets 15 are forced into the semiconductor package. Air within the package mold prior to the packaging process is pushed out by the advancing molding material 12, but air caught within molding material 12 while in container 10 has no means of escape and is entrapped within the package. As molding material 12 cools, it irreversibly hardens and the entrapped air creates voids in the packaging. As mentioned previously, the voids allow corrosion and delamination.

Figure 2:
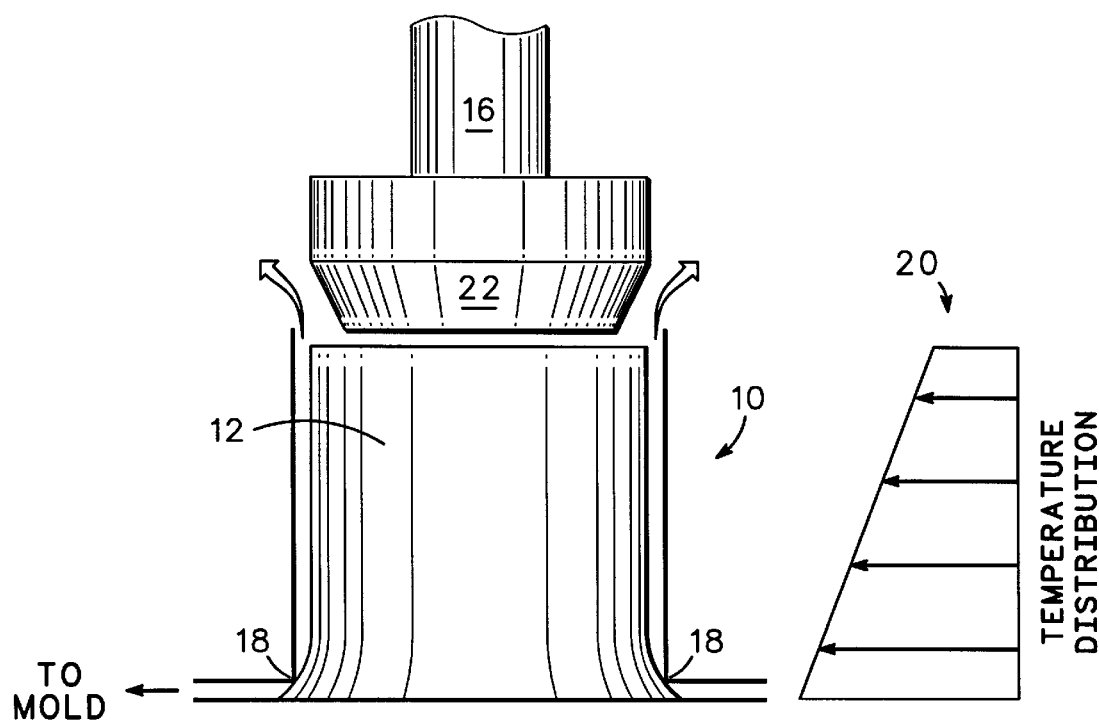
FIG. 2 shows a molding process and apparatus according to the present invention.

FIG. 2 illustrates the present invention and the method through which the present invention removes air from inside container 10 during the molding process.

Specifically, container 10 is first gradiently heated as shown by the temperature distribution graph 20. The greater heat is applied to container 10 near orifice 18, and the heat decreases at generally a linear rate in a direction opposite orifice 18. The lesser heat is near th e end of container 10 opposite orifice 18. As mentioned earlier, the degree to which molding material 12 becomes malleable is dependent upon the heat applied. Therefore, molding material 12 near orifice 18 will deform at a much greater rate than molding material 12 opposite orifice 18. Accordingly, as mechanism 16 compresses molding material 12, molding material 12 will compress and deform out. The hotter material will deform faster than the cooler material. Container 10 will begin filling entirely starting at the hotter material 12 and filling up in the direction of the cooler material 12. Any air in container 10 will be forced along the sides of container 10 in the direction of the cooler molding material 12. Eventually, all air will be forced out past the cooler molding material 12.

In order to allow the escaping air to completely escape out container 10, mechanism 16 is fitted with a narrow ram tip 22. Narrow ram tip 22 is slightly conical. As the narrow tip end of narrow ram tip 22 pushes into molding material 12, it begins the deformation process and forces the air up towards the opening of container 10. By the time mechanism 16 has advanced enough to fill the diameter of container 10, molding material 12 has deformed sufficiently to force the air out past the conical sides of narrow ram tip 22. Any air remaining in container 10 will be between the mass of molding material 12 and mechanism 16 and will not be forced into the package mold.

Up to now, the present invention has been explained in relation to a process for packaging semiconductors. This process, and associated apparatus, is very effective in producing semiconductor chips without voids in the packaging. Since voids cause corrosion and delamination resulting in reduced yields, the present invention is highly desirable over the prior art.

The present invention may be applied to areas other than the semiconductor industry. Many types of plastics become malleable when heat is applied. Further, such plastics will generally be supplied in forms that will allow air to be trapped within the plastics during the molding process. Without the present invention, the probability of entrapped air in the end product is high resulting in undesirable voids. It should be noted that plastics are not the only material which become malleable proportional to the heat applied. The present invention may be applied to all molding processes that require heating the molding material into a malleable form to compress the material into a mold.

We claim:

1. A method of applying a molding material which becomes malleable with heat into a designated mold while eliminating air entrapment within the molded material, the method comprising the steps of:

inserting the molding material into a container, the container attached to the designated mold to allow the molding material to pass from the container into the mold when a force is applied to the molding material;

applying a gradient heat to the molding material in the container to make the molding material more malleable, the gradient heat having a temperature distribution from a least heat to a greatest heat, wherein the greatest heat is applied to molding material closest to the mold and the least heat is applied to molding material furthest away from the mold; and forcing the molding material from the container into the mold while allowing air to escape along sides of the container and out a container opening furthest away from the mold.

2. A method of applying a molding material according to claim 1 wherein the step of forcing the molding material from the container comprises the step of applying a force from a narrow or conical tipped compression member such that when the compression member pushes against the molding material, the air is allowed to pass around the narrow or conical tip and out the container.

3. A method of applying a semiconductor packaging material which becomes malleable with heat into a designated mold while eliminating air entrapment within the molded semiconductor package, the method comprising the steps of:

inserting the packaging material into a container, the container attached to the designated mold to allow the packaging material to pass from the container into the mold when a force is applied to the packaging material;

applying a gradient heat to the packaging material in the container to make the packaging material more malleable, the gradient heat having a temperature distribution from a least heat to a greatest heat, wherein the greatest heat is applied to molding material closest to the mold and the least heat is applied to molding material furthest away from the mold; and forcing the packaging material from the container into the mold while allowing air to escape along sides of the container and out a container opening furthest away from the mold.

4. A method of applying a semiconductor packaging material according to claim 3 wherein the step of forcing the packaging material from the container comprises the step of applying a force from a narrow or conical tipped compression member such that when the compression member pushes against the packaging material, the air is allowed to pass around the narrow or conical tip and out the container.

* * * * *